United States Patent
Breen et al.

(10) Patent No.: US 9,887,316 B2
(45) Date of Patent: Feb. 6, 2018

(54) QUANTUM DOTS, METHOD, AND DEVICES

(71) Applicant: SAMSUNG ELECTRONICS CO., LTD., Suwon-si (KR)

(72) Inventors: Craig Breen, Somerville, MA (US); Jonathan S. Steckel, Carlisle, MA (US)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/041,618

(22) Filed: Sep. 30, 2013

(65) Prior Publication Data

US 2014/0027711 A1    Jan. 30, 2014

Related U.S. Application Data

(63) Continuation of application No. PCT/US2012/023467, filed on Feb. 1, 2012.
(Continued)

(51) Int. Cl.
*H01L 33/04* (2010.01)
*C09K 11/02* (2006.01)
(Continued)

(52) U.S. Cl.
CPC ............ *H01L 33/04* (2013.01); *C09K 11/025* (2013.01); *C09K 11/06* (2013.01); *C09K 11/08* (2013.01);
(Continued)

(58) Field of Classification Search
CPC ........ C09K 11/025; C09K 11/06; C09K 11/08
(Continued)

(56) References Cited

U.S. PATENT DOCUMENTS

6,005,707 A    12/1999    Berggren et al.
6,322,901 B1   11/2001    Bawendi et al.
(Continued)

FOREIGN PATENT DOCUMENTS

JP    2005038634 A    2/2005
KR    1020070097255 A    10/2007
(Continued)

OTHER PUBLICATIONS

Bulovic, V. et al. "Transparent light-emitting devices" *Nature* 1996, vol. 380, p. 29.
(Continued)

*Primary Examiner* — Jarrett Stark
*Assistant Examiner* — Charles N Ausar-El
(74) *Attorney, Agent, or Firm* — Cantor Colburn LLP

(57) ABSTRACT

A quantum dot including a fluorine-containing ligand attached to a surface thereof and having a coating comprising a fluoropolymer over at least a portion of the outer surface of the quantum dot. A method for preparing a quantum dot with a coating comprising a fluoropolymer over at least a portion of the outer surface of the quantum dot is also disclosed. The method comprises contacting a quantum dot having a fluorine-containing ligand attached to a surface thereof with a fluoropolymer to coat the fluoropolymer over at least a portion of the outer surface of the quantum dot. A device including the quantum dot taught herein is further disclosed. An emissive material including the quantum dot taught herein is further disclosed.

15 Claims, 2 Drawing Sheets

Fluorinated QD                    Fluorinated QD Micelle

Related U.S. Application Data

(60) Provisional application No. 61/470,891, filed on Apr. 1, 2011.

(51) Int. Cl.
  *C09K 11/06* (2006.01)
  *C09K 11/08* (2006.01)

(52) U.S. Cl.
  CPC ..... *C09K 2211/14* (2013.01); *Y10T 428/2998* (2015.01)

(58) Field of Classification Search
  USPC .......................................................... 257/13
  See application file for complete search history.

(56) References Cited

U.S. PATENT DOCUMENTS

| | | | |
|---|---|---|---|
| 6,548,168 | B1 | 4/2003 | Mulvaney et al. |
| 6,576,155 | B1 | 6/2003 | Barbera-Guillem |
| 7,065,285 | B2 | 6/2006 | Chen et al. |
| 7,115,688 | B1 | 10/2006 | Mirkin et al. |
| 7,306,823 | B2* | 12/2007 | Sager et al. ............... 427/217 |
| 7,332,211 | B1 | 2/2008 | Bulovic et al. |
| 7,358,525 | B2 | 4/2008 | Lee |
| 7,402,832 | B2* | 7/2008 | Lee .................. B82Y 10/00 257/17 |
| 7,457,508 | B2 | 11/2008 | Chen et al. |
| 7,700,200 | B2 | 4/2010 | Bulovic et al. |
| 8,470,617 | B2 | 6/2013 | Coe-Sullivan et al. |
| 8,876,272 | B2 | 11/2014 | Linton et al. |
| 8,901,333 | B2* | 12/2014 | Tulsky .............. C09K 11/025 428/407 |
| 9,073,751 | B2* | 7/2015 | Nie .................. B82Y 10/00 |
| 2003/0030706 | A1 | 2/2003 | Jagannathan et al. |
| 2003/0048346 | A1 | 3/2003 | Chow |
| 2003/0066998 | A1* | 4/2003 | Lee .................. B82Y 10/00 257/19 |
| 2004/0036130 | A1* | 2/2004 | Lee et al. .................... 257/409 |
| 2004/0131789 | A1 | 7/2004 | Brown |
| 2005/0117868 | A1 | 6/2005 | Chen et al. |
| 2005/0126628 | A1 | 6/2005 | Scher et al. |
| 2005/0227077 | A1 | 10/2005 | Sugiyama |
| 2005/0266246 | A1 | 12/2005 | Reiss et al. |
| 2005/0272159 | A1 | 12/2005 | Ismagilov et al. |
| 2006/0040103 | A1 | 2/2006 | Whiteford et al. |
| 2006/0083694 | A1 | 4/2006 | Kodas et al. |
| 2006/0196375 | A1 | 9/2006 | Coe-Sullivan et al. |
| 2007/0072309 | A1 | 3/2007 | Pris et al. |
| 2007/0103068 | A1 | 5/2007 | Bawendi et al. |
| 2007/0281140 | A1 | 12/2007 | Haubrich et al. |
| 2008/0001167 | A1 | 1/2008 | Coe-Sullivan et al. |
| 2008/0165235 | A1 | 7/2008 | Rolly et al. |
| 2008/0277626 | A1 | 11/2008 | Yang et al. |
| 2009/0034930 | A1 | 2/2009 | Chen et al. |
| 2009/0053462 | A1 | 2/2009 | Guo et al. |
| 2009/0278141 | A1 | 11/2009 | Coe-Sullivan et al. |
| 2010/0053931 | A1* | 3/2010 | Carroll et al. ................. 362/84 |
| 2010/0233094 | A1 | 9/2010 | Chung et al. |
| 2010/0283014 | A1 | 11/2010 | Breen et al. |
| 2010/0298504 | A1 | 11/2010 | Janczewski et al. |
| 2011/0052918 | A1 | 3/2011 | Krauss et al. |
| 2011/0068322 | A1 | 3/2011 | Pickett et al. |
| 2011/0091925 | A1 | 4/2011 | Ryan et al. |
| 2011/0095261 | A1* | 4/2011 | Kazlas et al. ................. 257/13 |
| 2011/0103064 | A1 | 5/2011 | Coe-Sullivan et al. |
| 2011/0140075 | A1* | 6/2011 | Zhou et al. .................. 257/13 |
| 2011/0245533 | A1 | 10/2011 | Breen et al. |
| 2011/0278503 | A1* | 11/2011 | Janczewski et al. ..... 252/301.36 |
| 2011/0291071 | A1* | 12/2011 | Kim et al. .................... 257/13 |
| 2013/0037778 | A1 | 2/2013 | Kazlas et al. |
| 2015/0287877 | A1* | 10/2015 | Ramprasad .......... C09K 11/565 257/13 |
| 2016/0027960 | A1* | 1/2016 | Coe-Sullivan ........ H01L 51/502 257/13 |

FOREIGN PATENT DOCUMENTS

| | | |
|---|---|---|
| WO | WO2006088877 A1 | 8/2006 |
| WO | WO2007117698 A2 | 10/2007 |
| WO | WO2007143197 A2 | 12/2007 |
| WO | WO2009014590 A2 | 1/2009 |
| WO | WO2009014590 A3 | 1/2009 |
| WO | WO2009035657 A1 | 3/2009 |
| WO | WO2009151515 A1 | 12/2009 |
| WO | WO2010014198 A1 | 2/2010 |
| WO | WO2011060180 A1 | 5/2011 |
| WO | WO2012001012 A2 | 1/2012 |
| WO | WO2012134629 A1 | 10/2012 |

OTHER PUBLICATIONS

Chen, et al., "Luminescent CdSe Quantum Dot Doped Stabilized Micelles", *Nano Letters* (2002), vol. 2, No. 11, pp. 1299-1302.
Dabbousi, et al., "(CdSe) ZnS Core-Shell Quantum Dots: Synthesis and Characterization of a Size Series of Highly Luminescent Nanocrystallites", *J. Phys. Chem.* 101, 9463, 1997.
Das, et al., "Nanomaterials in science and technology", *J. Sci. & Ind. Res.* (2009), vol. 68, pp. 657-667.
Dubertret, et al., "In Vivo Imaging of Quantum Dots Encapsulated in Phospholipid Micelles", *Science*, vol. 298 (Nov. 2002), pp. 1759-1762.
Fuchs, et al., "Making waveguides containing nanocrystalline quantum dots", *Proc. of SPIE* (2005) vol. 5592, p. 265.
Gao, et al., "In vivo cancer targeting and imaging with semiconductor quantum dots", *Nature Biotechnology* (2004), vol. 22, No. 8, pp. 969-976.
Gu, G. et al. "Transparent organic light emitting devices" *Appl. Phys. Lett.* 1996, 68, pp. 2606-2608.
Guo, et al., "Alternative Fluoropolymers to Avoid the Challenges Associated with Perfluorooctanoic Acid", *Ind. Eng. Chem. Res.* (2008), vol. 27, pp. 502-508.
Höpken, et al., "Synthesis of poly(vinyl ether)s with perfluoroalkyl pendant groups", *Makromol. Chem.* (1992), vol. 193, pp. 275-284.
Kortan, et al., "Nucleation and Growth of CdSe on ZnS Quantum Crystallite Seeds, and Vice Versa, in Inverse Micelle Media", *J. Am. Chem. Soc.* (1990), vol. 112, pp. 1327-1332.
Kumar, et al., "Optical properties of a transparent $CaF_2:Er^{3+}$ Fluoropolymer nanocomposite", *Appl. Phys. Lett.*(2005), vol. 86, p. 241105.
Lin, X., et al, "Formation of Long-range-ordered Nanocrystal Superlattices on Silicon Nitride Substrates", *J. Phys.Chem. B* (2001), 105, 3353-3357.
Mislaysky; B, "Fluorinated Polymers with Functional Groups—Synthesis and Applications. Langmuire—Blodgett Films from Functional Fluoropolymers", *Fluoropolymers 1: Synthesis*, Edited by Hougham, et al., (2002) Kluwer Academic Publishers, Ch. 7, pp. 91-110.
Moore, et al., "Growth of Ultralong $ZnS/SiO_2$ Core—Shell Nanowires by Volume and Surface Diffusion VLS Process", *J. Phys. Chem. C* (2008), vol. 112, pp. 2895-2903.
Murray, C., et al., "Synthesis and Characterization of Nearly Monodisperse CdE (E=S, Se, Te) Semiconductor Nanocrystallites" (Nov. 1993), *J. Am. Chem. Soc.*, 115, pp. 8706-8715.
Murray, C.B., et al., "Synthesis and Characterization of Monodisperse Nanocrystals and Close-Packed Nanocrystal Assemblies", *Annu. Rev. Mater. Sci.*, 2000, 30: pp. 545-610.
Nida, et al., "Photostability of quantum dots with amphiphilic polymer-based passivation strategies", *Nanotechnology* (2008), vol. 19, 035701 (6 pp).
Niebling, et al., "Excitation dynamics in polymer-coated semiconductor quantum dots with integrated dye molecules: The role of reabsorption", J. Appl. Phys. (2009), vol. 106, 104701 (6 pp).
PCT Search Report and Written Opinion dated Aug. 31, 2012 for International Application No. PCT/US2012/023467, which is the parent of this case.
Qin, et al., "Preparation and surface property of core-shell particles containing fluorinated polymer in shell", *Pigment & Resin Technology*, (2010), vol. 39, pp. 36-41.

(56) References Cited

OTHER PUBLICATIONS

Santhanam, et al., "Self-Assembly of Uniform Monolayer Arrays of Nanoparticles", *Langmuir* (2003) vol. 19, pp. 7881-7887.
Schlamp, M.C. et al., "Improved efficiencies in light emitting diodes made with CdSe(CdS) core/shell type nanocrystals and a semiconducting polymer", *J. Appl. Phys.*, vol. 82, No. 11, pp. 5837-5842, 1997.
Smith; A, et al., "Multicolor quantum dots for molecular diagnostics of cancer", *Expert Rev. Mol. Diagn.* (2006), vol. 6, No. 2, pp. 231-244.
Steckel, et al., "Blue Luminescence from (CdS)ZnS Core-Shell Nanocrystals", *Angew. Chem. Int. Ed.* (2004), vol. 43, pp. 2154-2158.
Travert-Branger, et al., "In Situ Electron-Beam Polymerization Stabilized Quantum Dot Micelles", *Langmuir* (2011), vol. 27, pp. 4258-4361.

\* cited by examiner

QUANTUM DOTS, METHOD, AND DEVICES

This application is a continuation of commonly owned International Application No. PCT/US2012/023467 filed 1 Feb. 2012, which published in the English language as PCT Publication No. WO 2012/134629 on 4 Oct. 2012, which International Application claims priority to U.S. Application No. 61/470,891 filed 1 Apr. 2011. Each of the foregoing is hereby incorporated herein by reference in its entirety.

FEDERALLY SPONSORED RESEARCH OR DEVELOPMENT

This invention was made with Government support under Contract No. FA9550-07-C-0056 awarded by the United States Air Force. The Government has certain rights in the invention.

TECHNICAL FIELD OF THE INVENTION

The present invention relates to the technical field of quantum dots, devices including quantum dots, and related methods.

SUMMARY OF THE INVENTION

In accordance with one aspect of the present invention there is provided a quantum dot including a fluorine-containing ligand attached to a surface thereof and including a coating comprising a fluoropolymer over at least a portion of the outer surface of the quantum dot.

As used herein, the term "fluoropolymer" refers to a polymer comprising a hydrocarbon backbone and including a first functional group comprising one or more fluorine atoms.

As used herein, the term "fluorine-containing ligand" refers to a ligand comprising one or more fluorine atoms. A fluorine-containing ligand may also be referred to herein as a fluorinated ligand.

A fluoropolymer may optionally further include one or more additional functional groups. An example of a preferred additional functional group comprises a hydroxyl group. Non-limiting examples of other additional functional groups are described herein.

A fluoropolymer can further comprise a hydrocarbon backbone and include a first functional group comprising an aliphatic moiety comprising a main chain including at least 2 carbon atoms wherein the first functional group further comprises one or more fluorine atoms. Such fluoropolymer may further include one or more additional functional groups.

In accordance with another aspect of the present invention, there is provided an emissive material comprising a quantum dot in accordance with the invention.

In accordance with another aspect of the present invention, there is provided a method for preparing a quantum dot including a coating comprising a fluoropolymer over at least a portion of an outer surface of the quantum dot, the method comprising:

contacting a quantum dot including a fluorine-containing ligand attached to a surface thereof with a fluoropolymer to coat the fluoropolymer over at least a portion of an outer surface of the quantum dot.

The step of contacting a quantum dot including a fluorine-containing ligand attached to a surface thereof with a fluoropolymer can comprise mixing the quantum dot including a fluorine-containing ligand attached to a surface thereof with a fluoropolymer in a liquid medium.

In accordance with another aspect of the present invention, there is provided a device comprising a pair of electrodes and including a layer therebetween, the layer comprising a quantum dot in accordance with the invention.

The device can further include one or more charge transport materials between the pair of electrodes.

A charge transport material can be disposed between the layer comprising a quantum dot in accordance with the invention and one of the electrodes.

Alternatively, the quantum dot in accordance with the invention can be dispersed in a charge transport material.

Such device can comprise a light-emitting device wherein the emissive material in the device comprises a quantum dot in accordance with the invention.

A device can optionally include one or more additional layers.

The foregoing, and other aspects described herein all constitute embodiments of the present invention.

It should be appreciated by those persons having ordinary skill in the art(s) to which the present invention relates that any of the features described herein in respect of any particular aspect and/or embodiment of the present invention can be combined with one or more of any of the other features of any other aspects and/or embodiments of the present invention described herein, with modifications as appropriate to ensure compatibility of the combinations. Such combinations are considered to be part of the present invention contemplated by this disclosure.

It is to be understood that both the foregoing general description and the following detailed description are exemplary and explanatory only and are not restrictive of the invention as claimed. Other embodiments will be apparent to those skilled in the art from consideration of the specification and practice of the invention disclosed herein.

Figure 1:
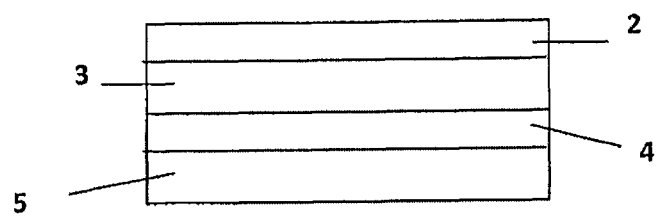
FIG. 1 schematically depicts an example of an embodiment of a device in accordance with one aspect of the present invention in cross-section.

The attached figures are simplified representations presented for purposes of illustration only; actual structures may differ in numerous respects, particularly including the relative scale of the articles depicted and aspects thereof.

For a better understanding to the present invention, together with other advantages and capabilities thereof, reference is made to the following disclosure and appended claims in connection with the above-described drawings.

DETAILED DESCRIPTION OF THE INVENTION

Various aspects and embodiments of the present inventions will be further described in the following detailed description.

In accordance with one aspect of the present invention there is provided a quantum dot including a fluorine-containing ligand attached to a surface thereof and including a coating comprising a fluoropolymer over at least a portion of the outer surface of the quantum dot.

In certain of the various aspects and embodiments of the present invention described herein, a quantum dot can include one or more fluorine-containing ligands attached to a surface thereof.

A fluoropolymer may optionally further include one or more additional functional groups. An example of a preferred additional functional group comprises a hydroxyl group. Non-limiting examples of other additional functional groups are described herein.

A fluoropolymer can comprise a hydrocarbon backbone and include a first functional group comprising an aliphatic moiety comprising a main chain including at least 2 carbon atoms wherein the first functional group further comprises one or more fluorine atoms. Such fluoropolymer may further include one or more additional functional groups.

In certain embodiments, the fluoropolymer comprises a hydrocarbon backbone and includes a first functional group comprising an aliphatic moiety comprising a main chain including 2 or more carbon atoms wherein the first functional group further comprises one or more fluorine atoms. For example, the aliphatic moiety can comprise a main chain including, e.g., but not limited to, 2-30 carbon atoms, 3-30 carbon atoms (e.g., but not limited to, 3-18, 3-15, 3-12, 3-9, 3-6, etc. carbon atoms). Other aliphatic moieties may also be determined by the skilled artisan to be useful or desirable. Optionally, the main chain can further comprise one or more hetero atoms. Such fluoropolymer may further include a one or more additional functional groups.

Examples of fluoropolymers include a group of polymers consisting of fluoropolymers (e.g., Teflon AF) brand fluoropolymers available from DuPont, Cytop® brand fluoropolymers available from Asahi), polymers derived from B-staged bisbenzocyclobutene monomers (e.g., Cyclotene® brand resins and Cyclotene® brand fluorinated resins available from Dow Chemical Company), phenolic resin, and fluorinated poly(aryl ether sulfide), poly(isobutylene), poly(diphenoxyphosphazene), fluorinated acrylate (ZPU series from Zen Photonics Co., LTD), poly(methyl methacrylate), poly(vinyl alcohol), poly(vinyl butyral), poly(vinylcarbazole), poly(vinyl fluoride), poly(methyl vinyl ether), polyethylene, polypropylene, polystyrene, poly(vinyl pyridine), poly(ethylene oxide), fluorinated acrylates, poly(siloxanes), poly(silanes), poly(diphenoxyphosphazenes), poly(vinyl ferrocene), polycarbonates, poly(cyclic olefin) such as Zenor® and Zenex® and the like.

Copolymers, including random and block copolymers, cross-linkable polymers, and blends of two or more polymers wherein one of the polymers comprises a fluoropolymer are also contemplated.

As discussed above, a fluoropolymer may further comprise one or more functional groups. Preferably additional functional groups are accessible for reaction with other functional groups to form linkages and/or that can provide one or more sites for additional functionalization of the fluoropolymer. Functional groups may include hydroxyl groups and/or any of the organic functional groups that are known to those skilled in the art. Examples of additional functional groups include, but are not limited to, acetals, ketals, acetylenic linkages, halides (e.g., acid chlorides, sulfonyl halides, alkyl halides, haloacetyl, arylhaloside), alcohols, aldehydes, ethylenic linkages (e.g., vinyl, acryloyl derivitives), esters, amides, amines, carboxylic acids, carboxylic anhydrides, azo groups (e.g., diazoalkane, diazoacetyl), boranes, carbamates, epoxides, glycidyl ethers, glycidyl esters, thioethers, thiols, di-sulfides, cyano linkages, isothiocyanates, isocyanates, nitro groups, sulfonyl halides, sulfoxides, phenols, thiophenols, aromatics, hydrazides, aryl azides, nitrenes, imidoesters, benzophenones, carbonyldiimidazoles, carbodiimides, aziridines, alkylphosphates, siloxanes, an aliphatic chain (branched or unbranched), an aromatic group or chain (e.g., polystyrene), a polar aprotic group or chain (e.g., PEG chain or other polyether), a silicon containing group (e.g., PDMS or other siloxane), and the like. Examples further include other groups or chains that incorporate functionalities in two or more of the above categories. Optionally any of the above can be included in an oligomeric or polymer chain. Such oligomeric and/or polymer chains can be incorporated into a fluoropolymer randomly or blocked. For example, these additional functionalities can be incorporated randomly with the fluorinated group(s) or in distinct blocks.

One or more additional functional groups can be selected for inclusion in a fluoropolymer to obtain a coated quantum dot having predetermined properties based on the intended use thereof. For example, functional groups can be included in the fluoropolymer such that the coated quantum dot can exhibit hydrophobic characteristics, functional groups can be included in the fluoropolymer such that the coated quantum dot can exhibit hydrophilic characteristics, etc.

Figure 2:
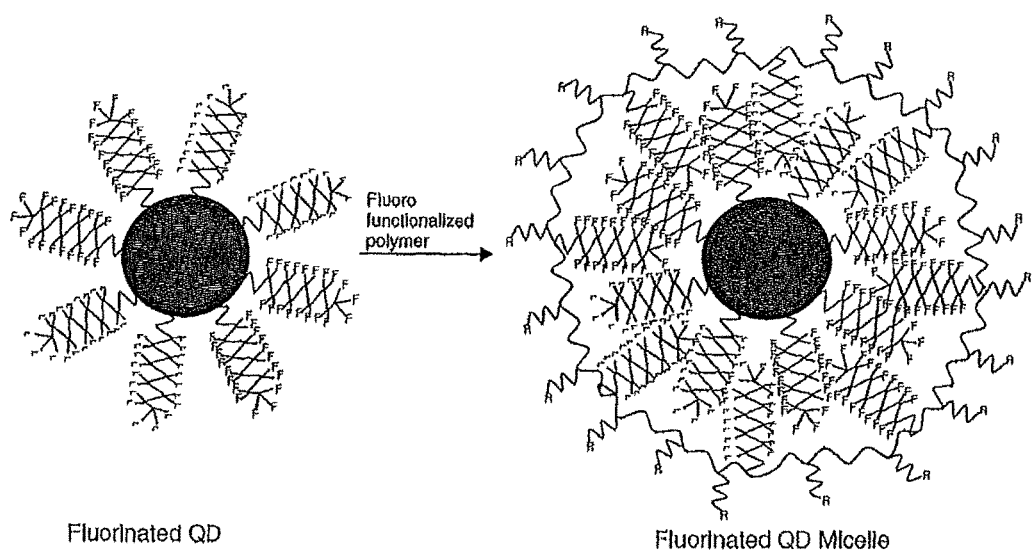
FIG. 2 schematically depicts an example of an embodiment of a quantum dot in accordance with one aspect of the present invention.

FIG. 2 schematically depicts an example of an embodiment of a quantum dot in accordance with one aspect of the present invention. The depicted example shows a quantum dot including a plurality of perfluorinated ligands surrounded by a fluoropolymer with the fluorine-containing functional groups on the polymer associated with the fluorine-containing ligands. The fluoropolymer coating depicted also includes a plurality of non-fluorine containing functional groups on the outer surface of the coated particle.

As depicted, the fluorine-containing first functional group of the fluoropolymer interacts with the fluorine-containing ligand on the quantum dot to form a fluorinated quantum dot micelle-type structure.

Functionalized fluoropolymers may be prepared by conventional methods known to those skilled in the art, or may be commercially available from a variety of sources.

The thickness of the fluoropolymer over the quantum dot is preferably less than or equal to 100 nm, e.g., less than 90 nm, less than 80 nm, less than 70 nm, less than 60 nm, less than 50 nm, less than 40 nm, less than 30 nm, less than 20 nm, less than 10 nm, less than 5 nm, less than 2 nm, less than 1 nm. Other thicknesses may be determined to be useful or desirable by the skilled artisan based on the particular end-use application in which the quantum dot is to be included.

The thickness of the coating can be increased to a predetermined thickness, for example, by repeated exposure of the fluoropolymer coated quantum dot to additional fluoropolymer in a liquid medium.

In certain embodiments, an outer portion of the fluoropolymer layer can be functionalized with a group or species that has predetermined functionalities.

In certain embodiments, an outer portion of the fluoropolymer layer can be functionalized with a group or species that has energy transferring properties. Examples of such groups or species can include, but are not limited to, small organic molecules of the type included in charge transport layers.

A quantum dot (e.g., semiconductor nanocrystal) can include one or more ligand groups attached thereto, at least one of which includes one or more fluorine atoms. A ligand is typically attached to a surface of a quantum dot. For example, a ligand can be attached to a surface of a quantum dot core, to a surface of a core/shell quantum dot, or to a surface of another type of quantum dot structure.

Quantum dots including a fluorinated ligand can be prepared by exchanging at least one or more ligands that become attached to a nanocrystal surface during, e.g., colloidal synthesis, with ligands that include a functional head such as, by way of example, a thiol, carbodithioate, carbodithioic acid, amine, thiourea, amide, phosphine oxide, phosphonic or phosphinic acid, thiophosphonic or thiophosphinic acid, which functional head can be substituted with alkyl and/or aryl units that are fluorinated (e.g., but not limited to, perfluorinated or partially fluorinated).

A preferred fluorine-containing ligand comprises a fluorinated phosphonic acid.

Other fluorinated ligands may be readily identified by the skilled artisan. Selection of a fluorinated ligand can be based on the intended end-use and desired properties of the quantum dot including the fluorinated ligand.

Ligands can be attached to a quantum dot by various known techniques. For example, ligands can be derived from a coordinating solvent that may be included in the reaction mixture during the process of growing quantum dots. Ligands can be added to the reaction mixture. Ligands can be derived from a reagent or precursor included in the reaction mixture for synthesizing the quantum dots.

A quantum dot surface that includes ligands derived from the growth process or otherwise can be modified by repeated exposure to an excess of a competing ligand group (including, e.g., but not limited to, coordinating group) to form an overlayer. For example, a quantum dot can be exposed to ligand group including a fluorine group.

A ligand preferably includes a species which exhibits an affinity for the quantum dot surface and a moiety having an affinity for a suspension or dispersion medium. Such affinity can improve the stability of the suspension and discourages flocculation of the quantum dot.

In certain embodiments, quantum dots can include one or more additional ligands attached to an outer surface.

Examples of additional ligands include, without limitation, an alkyl (e.g., $C_1$-$C_{20}$) species. An alkyl species can be straight-chain, branched, or cyclic. An alkyl species can be substituted or unsubstituted. An alkyl species can include a hetero-atom in the chain or cyclic species. A ligand can include an aromatic species, which can be substituted or unsubstituted. An aromatic species can further include a hetero-atom.

Other ligand examples include alkyl phosphines, alkyl phosphine oxides, alkyl phosphonic acids, or alkyl phosphinic acids, pyridines, furans, and amines. More specific examples include, but are not limited to, pyridine, tri-n-octyl phosphine (TOP), tri-n-octyl phosphine oxide (TOPO), tris-hydroxylpropylphosphine (tHPP) and octadecylphosphonic acid ("ODPA"), benzylphosphonic acid, benzylphosphonic acid including at least one substituent group on the ring of the benzyl group, a conjugate base of such acids, (e.g., 4-hydroxybenzylphosphonic acid, a conjugate base of the acid, 3,5-di-tert-butyl-4-hydroxybenzylphosphonic acid, a conjugate base of the acid, etc.), and. mixtures including one or more of the foregoing. Technical grade TOPO can be used.

Suitable coordinating ligands can be purchased commercially or prepared by ordinary synthetic organic techniques.

Other ligands may be determined to be useful or desirable.

In accordance with another aspect of the present invention, there is provided a method for preparing a quantum dot including a coating comprising a fluoropolymer over at least a portion of the outer surface of the quantum dot, the method comprising:

contacting a quantum dot including a fluorine-containing ligand attached to a surface thereof with a fluoropolymer to coat the fluoropolymer over at least a portion of an outer surface of the quantum dot.

Preferably, the fluoropolymer surrounds the quantum dot.

The step of contacting a quantum dot including a fluorine-containing ligand attached to a surface thereof with a fluoropolymer can further comprise mixing quantum dot(s) including a fluorine-containing ligand attached to a surface thereof with a fluoropolymer in a liquid medium.

Optionally, the fluoropolymer can be prepared in situ in the liquid medium by known techniques (including, but not limited to, cross-linking, curing, etc.).

A liquid medium can comprise a solvent or mixture of solvents Preferably, the solvent or mixture of solvents do not chemically react with the fluoropolymer and/or quantum dot including a ligand including one or more fluorine atoms which may be dispersed therein.

In certain embodiments of the above method, the quantum dot(s) including a fluorinated ligand and fluoropolymer are provided in a compatible solvent or mixtures of such solvents. Compatible in this respect means that the quantum dot including a fluorinated ligand and fluoropolymer should be dispersible in the respective solvent. Examples of solvents include, but are not limited to, aprotic solvents and/or non-polar solvents, such as an aprotic non-polar solvent, that are compatible with the quantum dot and the fluoropolymer.

A further example of a suitable non-polar solvent is a non-polar ionic liquid.

Examples of preferred solvents are fluorinated solvents. Examples of fluorinated solvents include, but are not limited to, 1-ethyl-3-methylimidazolium bis[(trifluoromethyl)sulfonyl]amide bis(triflyl)amide, 1-ethyl-3-methylimidazolium bis-[(trifluoromethyl)sulfonyl]amide trifluoroacetate, 1-butyl-3-methylimidazolium hexafluorophosphate, 1-hexyl-3-methylimidazolium bis(trifluoromethylsulfonyl)imide, 1-butyl-3-methyl-imidazolium bis(trifluoromethylsulfonyl)imide, trihexyl(tetradecyl)phosphonium bis[oxalato (2-)]borate, 1-hexyl-3-methyl imidazolium tris(pentafluoroethyl)trifluorophosphate, 1-butyl-3-methyl-imidazolium hexafluorophosphate, tris(pentafluoroethyl)trifluorophosphate, trihexyl(tetradecyl)phosphonium, N"-ethyl-N,N,N',N'-tertramethylguanidinium, 1-butyl-1-methyl pyrrolidinium tris(pentafluoroethyl)trifluorophosphate, 1-butyl-1-methylpyrrolidinium bis(trifluoromethylsulfonyl)imide, 1-butyl-3-methyl imidazolium hexafluorophosphate, 1-ethyl-3-methylimidazolium bis(trifluoromethylsulfonyl)imide and 1-n-butyl-3-methylimidazolium.

Other examples of fluorinated solvents include liquid perfluorocompounds. More specific examples include, without limitation, perfluorodecalin and the Fluorinert series of solvents sold by 3M.

The solvent may be removed after interaction between the fluoropolymer and the quantum dot has been allowed to occur.

In a method in accordance with one aspect of the present invention, a quantum dot including a ligand including one or more fluorine atoms is contacted with a fluoropolymer. As a result, a coating comprising the fluoropolymer is formed over at least a portion of an outer surface of the quantum dot.

While not wishing to be bound by theory, it is believed that the fluorine-containing ligand(s) attached to the quantum dot surface interacts with the fluorine functionality on the fluoropolymer fixing or attaching the fluoropolymer to at least a portion of the outer surface of the quantum dot.

Preferably, the fluoropolymer surrounds the quantum dot.

Optionally, a quantum dot including a ligand including one or more fluorine atoms and a fluoropolymer can be mixed in a compatible solvent and the solvent is removed.

Thereafter, the quantum dots having the fluoropolymer fixed or attached to a surface of the quantum dot can be optionally re-suspended in a second solvent in which fluoropolymer coating is readily dispersible.

In a further embodiment, the quantum dot including a fluorine-containing ligand is dispersed in a first liquid, a fluoropolymer is dispersed in a second liquid which is immiscible with the first liquid, and the two solutions are mixed to extract the quantum dot including a fluorine-containing ligand into the second liquid including the fluoropolymer to facilitate interaction between the quantum dot including the fluorine-containing ligand and the fluoropolymer and coating the fluoropolymer over at least a portion of an outer surface of the quantum dot including the fluorine-containing ligand.

In accordance with another aspect of the present invention, there is provided device comprising a pair of electrodes and including a layer therebetween, wherein the layer comprises a quantum dot in accordance with the invention.

The device can further include one or more charge transport materials between the pair of electrodes.

A charge transport material can be disposed between the layer comprising the quantum dot taught herein and one of the electrodes.

Alternatively, the quantum dot taught herein can be dispersed in a charge transport material.

When a quantum dot in accordance with the invention is included, for example, as an emissive material in a light emitting device, the fluoropolymer coating can function as an electronic insulating layer around the quantum dot which can inhibit direct charge injection and promote energy transfer as the mode of quantum dot excitation.

It is believed that inclusion of quantum dots in accordance with the invention in an emissive material in a light-emitting device can improve the lifetime, stability, and or efficiency thereof.

Preferably, the composition of any material in the device in contact with the quantum dot is selected to be chemically dissimilar or incompatible with the fluoropolymer coating so as to inhibit diffusion of such material through the fluoropolymer to the quantum dot surface. Such chemical dissimilarity or incompatibility can provide a barrier to diffusion of such material toward the quantum dot surface.

A device can optionally include one or more additional layers.

FIG. 1 depicts an example of an embodiment of a device in accordance with one aspect of the present invention in cross-section.

The depicted device example includes a substrate 5. A substrate can be opaque or transparent. A transparent substrate can be used, for example, in the manufacture of a transparent light emitting device. See, for example, Bulovic, V. et al., *Nature* 1996, 380, 29; and Gu, G. et al., *Appl. Phys. Lett.* 1996, 68, 2606-2608, each of which is incorporated by reference in its entirety.

The substrate can be rigid or flexible. Examples of substrate materials include, without limitation, glass, plastic, metal, insulated metal foil, semiconductor wafer, etc. The substrate can be a substrate commonly used in the art. Preferably the substrate has a smooth surface. A substrate surface free of defects is particularly desirable.

Substrates including patterned ITO are commercially available and can be used in making a device according to the present invention.

Device layers (e.g., a first electrode 4, a layer 3 comprising the quantum dot taught herein, and a second electrode 2) are disposed over the substrate. Other optional device layers (not shown) may also be included in the device. The particular device layers, materials included in each of the device layers, and the device structure are selected based on the type of device desired. For example, the materials and structures for various light emitting devices, photovoltaic devices, and other devices can be readily determined and carried out by one of ordinary skill in the relevant art. Such selection of materials and structure, and preparation thereof, can be readily determined and carried out by one of ordinary skill in the relevant art.

An example of a device comprising a light-emitting device can include a first electrode disposed over a substrate, a second electrode disposed over the first electrode, and a layer comprising an emissive material between the two electrodes.

The emissive material can comprise a quantum dot taught herein

In accordance with another aspect of the present invention, there is provided an emissive material comprising a quantum dot taught herein.

An emissive material can further include other materials (e.g., a host material and/or other additives.) See, for example, International Application No. PCT/US2009/002789 of Coe-Sullivan et al, filed 6 May 2009, entitled: "Solid State Lighting Devices Including Quantum Confined Semiconductor Nanoparticles, An Optical Component For A Solid State Light Device, And Methods", and other documents identified herein, each of which is incorporated herein by reference in its entirety. In certain embodiments, the other material included in the emissive material is non-optically active.

An emissive material can further comprise one or more different quantum dots, at least one of which comprises a quantum dot taught herein. The differences can be based, for example, on different composition, different size, different structure, or other distinguishing characteristic or property of the quantum dot (without regard to whether or not it includes a fluoropolymer attached thereto).

The color of the light output of a light-emitting device can be controlled by the selection of the composition, structure, and size of the quantum dots included in the emissive material.

The emissive material included in a light-emitting device is preferably included in the device as a layer. In certain embodiments, the emissive layer can comprise one or more layers. Each layer may include an emissive material that is the same as or different from an emissive material included in another layer. A layer may further include a mixture of emissive materials having different emissive characteristics.

In certain embodiments, the emissive layer can have a thickness in a range from about 1 nm to about 20 nm. In certain embodiments, the emissive layer can have a thickness in a range from about 1 nm to about 10 nm. In certain embodiments, the emissive layer can have a thickness in a range from about 3 nm to about 6 about nm. In certain embodiments, the emissive layer can have a thickness of about 4 nm.

The emissive material can comprise one or more layers, which can comprise the same or different emissive materials.

A layer including an emissive material comprising, for example, a plurality of quantum dots taught herein can be a monolayer of semiconductor nanocrystals. Other thicknesses can also be used.

An emissive material can be deposited by spin-casting, screen-printing, inkjet printing, gravure printing, roll coating, drop-casting, Langmuir-Blodgett techniques, contact printing or other techniques known or readily identified by one skilled in the relevant art.

The emissive material can be patterned or unpatterned.

One electrode can be, for example, an anode comprising a high work function (e.g., greater than 4.0 eV) hole-injecting conductor, such as an indium tin oxide (ITO) layer. Other anode materials include other high work function hole-injection conductors including, but not limited to, for example, tungsten, nickel, cobalt, platinum, palladium and their alloys, gallium indium tin oxide, zinc indium tin oxide, titanium nitride, polyaniline, or other high work function hole-injection conducting polymers. An electrode can be light transmissive or transparent. In addition to ITO, examples of other light-transmissive electrode materials include conducting polymers, and other metal oxides, low or high work function metals, conducting epoxy resins, or carbon nanotubes/polymer blends or hybrids that are at least partially light transmissive. An example of a conducting polymer that can be used as an electrode material is poly(ethlyendioxythiophene), sold by Bayer AG under the trade mark PEDOT. Other molecularly altered poly(thiophenes) are also conducting and could be used, as well as emaraldine salt form of polyaniline.

The other electrode can be, for example, a cathode comprising a low work function (e.g., less than 4.0 eV), electron-injecting, metal, such as Al, Ba, Yb, Ca, a lithium-aluminum alloy (Li:Al), a magnesium-silver alloy (Mg:Ag), or lithium fluoride-aluminum (LiF:Al). Other examples of cathode materials include silver, gold, ITO, etc. An electrode, such as Mg:Ag, can optionally be covered with an opaque protective metal layer, for example, a layer of Ag for protecting the cathode layer from atmospheric oxidation, or a relatively thin layer of substantially transparent ITO. An electrode can be sandwiched, sputtered, or evaporated onto the exposed surface of the solid layer.

One or both of the electrodes can be patterned.

The electrodes of the device can be connected to a voltage source by electrically conductive pathways.

In a light-emitting device, electroluminescence can be produced by the emissive material included in the device when a voltage of proper polarity is applied across the heterostructure.

A light-emitting device can further include one or more charge transport layers (which can be organic or inorganic). Charge transport layers can be position between the electrodes.

Charge transport layers comprising organic materials and other information related to fabrication of organic charge transport layers are discussed in more detail in U.S. patent application Ser. No. 11/253,612 for "Method And System For Transferring A Patterned Material", filed 21 Oct. 2005, U.S. patent application Ser. No. 11/253,595 for "Light Emitting Device Including Semiconductor Nanocrystals", filed 21 Oct. 2005, and International Application No. PCT/US2009/002123, filed 3 Apr. 2009, by QD Vision, Inc., et al, entitled "Light-Emitting Device Including Quantum Dots", which published as WO2009/123763 on 8 Oct. 2009. The foregoing patent applications are hereby incorporated herein by reference in its entirety.

Organic charge transport layers may be disposed by known methods such as a vacuum vapor deposition method, a sputtering method, a dip-coating method, a spin-coating method, a casting method, a bar-coating method, a roll-coating method, and other film deposition methods. Preferably, organic layers are deposited under ultra-high vacuum (e.g., ≤$10^{-8}$ torr), high vacuum (e.g., from about $10^{-8}$ torr to about $10^{-5}$ torr), or low vacuum conditions (e.g., from about $10^{-5}$ torr to about $10^{-3}$ torr). Most preferably, the organic layers are deposited at high vacuum conditions from about $1\times10^{-7}$ to about $5\times10^{-6}$ torr. Alternatively, organic layers may be formed by multilayer coating while appropriately selecting solvent for each layer.

Charge transport layers including inorganic materials and other information related to fabrication of inorganic charge transport layers are discussed further below and in more detail in U.S. Patent Application No. 60/653,094 for "Light Emitting Device Including Semiconductor Nanocrystals", filed 16 Feb. 2005, U.S. patent application Ser. No. 11/354,185, filed 15 Feb. 2006 (U.S. Published Application No. 2007/0103068), and International Application No. PCT/US2009/002123, filed 3 Apr. 2009, by QD Vision, Inc., et al, entitled "Light-Emitting Device Including Quantum Dots", which published as WO2009/123763 on 8 Oct. 2009, the disclosures of each of which are hereby incorporated herein by reference in their entireties.

Charge transport layers comprising an inorganic semiconductor can be deposited at a low temperature, for example, by a known method, such as a vacuum vapor deposition method, an ion-plating method, sputtering, inkjet printing, sol-gel techniques, etc.

In some applications, the substrate can further include a backplane. The backplane can include active or passive electronics for controlling or switching power to individual pixels or light-emitting devices. Including a backplane can be useful for applications such as displays, sensors, or imagers. In particular, the backplane can be configured as an active matrix, passive matrix, fixed format, direct drive, or hybrid. The display can be configured for still images, moving images, or lighting. A display including an array of light emitting devices can provide white light, monochrome light, or color-tunable light.

In addition to the charge transport layers, a device may optionally further include one or more charge-injection layers, e.g., a hole-injection layer (either as a separate layer or as part of the hole transport layer) and/or an electron-injection layer (either as a separate layer as part of the electron transport layer). Charge injection layers comprising organic materials can be intrinsic (un-doped) or doped.

One or more charge blocking layers may still further optionally be included. For example, an electron blocking layer (EBL), a hole blocking layer (HBL), or an exciton blocking layer (eBL), can be introduced in the structure. A blocking layer can include, for example, 3-(4-biphenylyl)-4-phenyl-5-tert butylphenyl-1,2,4-triazole (TAZ), 3,4,5-triphenyl-1,2,4-triazole, 3,5-bis(4-tert-butylphenyl)-4-phenyl-1,2,4-triazole, bathocuproine (BCP), 4,4',4"-tris{N-(3-methylphenyl)-N-phenylamino} triphenylamine (m-MTDATA), polyethylene dioxythiophene (PEDOT), 1,3-bis(5-(4-diphenylamino)phenyl-1,3,4-oxadiazol-2-yl)benzene, 2-(4-biphenylyl)-5-(4-tertbutylphenyl)-1,3,4-oxadiazole, 1,3-bis[5-(4-(1,1-dimethylethyl)phenyl)-1,3,4-oxadiazol-5,2-yl)benzene, 1,4-bis(5-(4-diphenylamino)phenyl-1,3,4-oxadiazol-2-yl)benzene, 1,3,5-tris[5-(4-(1,1-dimethylethyl)phenyl)-1,3,4-oxadiazol-2-yl)benzene, or 2,2',2"-(1,3,5-Benzinetriyl)-tris(1-phenyl-1-H-benzimidazole) (TPBi).

Charge blocking layers comprising organic materials can be intrinsic (un-doped) or doped.

Charge injection layers (if any), and charge blocking layers (if any) can be deposited by spin coating, dip coating, vapor deposition, or other thin film deposition methods. See, for example, M. C. Schlamp, et al., J. Appl. Phys., 82, 5837-5842, (1997); V. Santhanam, et al., Langmuir, 19, 7881-7887, (2003); and X. Lin, et al., J. Phys. Chem. B, 105, 3353-3357, (2001), each of which is incorporated by reference in its entirety.

Other multilayer structures may optionally be used (see, for example, U.S. patent application Ser. No. 10/400,907 (now U.S. Pat. No. 7,332,211) and Ser. No. 10/400,908 (now U.S. Pat. No. 7,700,200), filed Mar. 28, 2003, each of which is incorporated by reference in its entirety).

A light-emitting device including an emissive material comprising a plurality of quantum dots (e.g., semiconductor nanocrystals) taught herein is typically processed in a controlled (oxygen-free and moisture-free) environment.

An example of a preferred light emitting device architecture is described in International Application No. PCT/US2009/002123, filed 3 Apr. 2009, by QD Vision, Inc., et al, entitled "Light-Emitting Device Including Quantum Dots", which published as WO2009/123763 on 8 Oct. 2009, which is hereby incorporated herein by reference in its entirely.

Other materials, techniques, methods, applications, and information that may be useful with the present invention are described in: International Application No. PCT/US2007/013152, filed Jun. 4, 2007, of Coe-Sullivan, et al., for "Light-Emitting Devices And Displays With Improved Performance"; International Application No. PCT/US2010/056397 of Kazlas, et al., filed 11 Nov. 2010, entitled "Device Including Quantum Dots", and International Application No. PCT/US2008/013504, filed Dec. 8, 2008, entitled "Flexible Devices Including Semiconductor Nanocrystals, Arrays, and Methods", of Kazlas, et al., which published as WO2009/099425 on Aug. 13, 2009, U.S. patent application Ser. No. 11/253,612 for "Method And System For Transferring A Patterned Material", filed 21 Oct. 2005 (U.S. Published Application No. 2006/0196375A1), and Ser. No. 11/253,595 for "Light Emitting Device Including Semiconductor Nanocrystals", filed 21 Oct. 2005 (U.S. Published Application No. 2008/0001167A1), International Application No. PCT/US2007/008873, filed Apr. 9, 2007, of Coe-Sullivan et al., for "Composition Including Material, Methods Of Depositing Material, Articles Including Same And Systems For Depositing Material"; International Application No. PCT/US2008/010651, filed 12 Sep. 2008, of Breen, et al., for "Functionalized Nanoparticles And Method" and International Application No. PCT/US2009/004345, filed 28 Jul. 2009 of Breen et al., for "Nanoparticle Including Multi-Functional Ligand And Method", and International Application No. PCT/US2009/002789 of Coe-Sullivan et al, filed 6 May 2009, entitled: "Solid State Lighting Devices Including Quantum Confined Semiconductor Nanoparticles, An Optical Component For A Solid State Light Device, And Methods each of the foregoing being hereby incorporated herein by reference in its entirety.

A device can further include a cover, coating or layer over the surface of the device opposite the substrate for protection from the environment (e.g., dust, moisture, and the like) and/or scratching or abrasion. In a further embodiment, the cover can further optionally include a lens, prismatic surface, etc. Anti-reflection, light polarizing, and/or other coatings can also optionally be included over the pattern.

Optionally, a sealing material (e.g., UV curable epoxy or other sealant) can be further added around any uncovered edges around the perimeter of the device.

A quantum dot is a nanometer sized particle that can have optical properties arising from quantum confinement. The particular composition(s), structure, and/or size of a quantum dot can be selected to achieve the desired wavelength of light to be emitted from the quantum dot upon stimulation with a particular excitation source. In essence, quantum dots may be tuned to emit light across the visible spectrum by changing their size. See C. B. Murray, C. R. Kagan, and M. G. Bawendi, Annual Review of Material Sci., 2000, 30: 545-610 hereby incorporated by reference in its entirety.

A quantum dot can have an average particle size in a range from about 1 to about 1000 nanometers (nm), and preferably in a range from about 1 to about 100 nm. In certain embodiments, quantum dots have an average particle size in a range from about 1 to about 20 nm (e.g., such as about 5, 6, 7, 8, 9, 10, 11, 12, 13, 14, 15, 16, 17, 18, 19, or 20 nm). In certain embodiments, quantum dots have an average particle size in a range from about 1 to about 10 nm. Quantum dots can have an average diameter less than about 150 Angstroms (Å). In certain embodiments, quantum dots having an average diameter in a range from about 12 to about 150 Å can be particularly desirable. However, depending upon the composition, structure, and desired emission wavelength of the quantum dot, the average diameter may be outside of these ranges.

For convenience, the size of quantum dots can be described in terms of a 'diameter'. In the case of spherically shaped quantum dots, diameter is used as is commonly understood. For non-spherical quantum dots, the term diameter can typically refer to a radius of revolution (e.g., a smallest radius of revolution) in which the entire non-spherical quantum dot would fit.

Preferably, a quantum dot comprises a semiconductor nanocrystal. In certain embodiments, a semiconductor nanocrystal has an average particle size in a range from about 1 to about 20 nm, and preferably from about 1 to about 10 nm. However, depending upon the composition, structure, and desired emission wavelength of the quantum dot, the average diameter may be outside of these ranges.

A quantum dot can comprise one or more semiconductor materials.

Examples of semiconductor materials that can be included in a quantum dot (including, e.g., semiconductor nanocrystal) include, but are not limited to, a Group IV element, a Group II-VI compound, a Group II-V compound, a Group III-VI compound, a Group III-V compound, a Group IV-VI compound, a Group I-III-VI compound, a Group II-IV-VI compound, a Group II-IV-V compound, an alloy including any of the foregoing, and/or a mixture including any of the foregoing, including ternary and quaternary mixtures or alloys. A non-limiting list of examples include ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing, including ternary and quaternary mixtures or alloys.

A quantum dot can comprise a core comprising one or more semiconductor materials and a shell comprising one or more semiconductor materials, wherein the shell is disposed over at least a portion, and preferably all, of the outer surface of the core. A quantum dot including a core and shell is also referred to as a "core/shell" structure.

Examples of semiconductor materials that can be included in a core include, but are not limited to, a Group IV element, a Group II-VI compound, a Group II-V compound, a Group III-VI compound, a Group III-V compound, a Group IV-VI compound, a Group I-III-VI compound, a Group II-IV-VI compound, a Group II-IV-V compound, alloys including any of the foregoing, and/or mixtures including any of the foregoing, including ternary and quaternary mixtures or alloys. Examples include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing, including ternary and quaternary mixtures or alloys.

A shell can be a semiconductor material having a composition that is the same as or different from the composition of the core. The shell can comprise an overcoat including one or more semiconductor materials on a surface of the core. Examples of semiconductor materials that can be included in a shell include, but are not limited to, a Group IV element, a Group II-VI compound, a Group II-V compound, a Group III-VI compound, a Group III-V compound, a Group IV-VI compound, a Group I-III-VI compound, a Group II-IV-VI compound, a Group II-IV-V compound, alloys including any of the foregoing, and/or mixtures including any of the foregoing, including ternary and quaternary mixtures or alloys. Examples include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing. For example, ZnS, ZnSe or CdS overcoatings can be grown on CdSe or CdTe semiconductor nanocrystals.

In a core/shell quantum dot, the shell or overcoating may comprise one or more layers. The overcoating can comprise at least one semiconductor material which is the same as or different from the composition of the core. Preferably, the overcoating has a thickness from about one to about ten monolayers. An overcoating can also have a thickness greater than ten monolayers. In certain embodiments, more than one overcoating can be included on a core.

In certain embodiments, the surrounding "shell" material can have a band gap greater than the band gap of the core material. In certain other embodiments, the surrounding shell material can have a band gap less than the band gap of the core material.

In certain embodiments, the shell can be chosen so as to have an atomic spacing close to that of the "core" substrate. In certain other embodiments, the shell and core materials can have the same crystal structure.

Examples of quantum dot (e.g., semiconductor nanocrystal) (core)shell materials include, without limitation: red (e.g., (CdSe)CdZnS (core)shell), green (e.g., (CdZnSe) CdZnS (core)shell, etc.), and blue (e.g., (CdS)CdZnS (core) shell.

Quantum dots can have various shapes, including, but not limited to, sphere, rod, disk, other shapes, and mixtures of various shaped particles.

One example of a method of manufacturing a quantum dot (including, for example, but not limited to, a semiconductor nanocrystal) is a colloidal growth process. Colloidal growth can occur by injection an M donor and an X donor into a hot coordinating solvent. M can comprise, for example, one or more metals including, but not limited to, for example, cadmium, zinc, magnesium, mercury, aluminum, gallium, indium, thallium, or mixtures thereof. X can comprise, for example, one or more chalcogens or pnictogens, including, but not limited to, oxygen, sulfur, selenium, tellurium, nitrogen, phosphorus, arsenic, antimony, or mixtures thereof.

An M donor can be an inorganic compound, an organometallic compound, or elemental metal. For example, an M donor can comprise cadmium, zinc, magnesium, mercury, aluminum, gallium, indium or thallium, and the X donor can comprise a compound capable of reacting with the M donor to form a material with the general formula MX.

An X donor can comprise a chalcogenide donor or a pnictide donor, such as a phosphine chalcogenide, a bis (silyl)chalcogenide, dioxygen, an ammonium salt, or a tris (silyl)pnictide. Suitable X donors include, for example, but are not limited to, dioxygen, bis(trimethylsilyl)selenide $((TMS)_2Se)$, trialkyl phosphine selenides such as (tri-noctylphosphine)selenide (TOPSe) or (tri-n-butylphosphine) selenide (TBPSe), trialkyl phosphine tellurides such as (tri-n-octylphosphine)telluride (TOPTe) or hexapropylphosphorustriamide telluride (HPPTTe), bis(trimethylsilyl)telluride $((TMS)_2Te)$, bis(trimethylsilyl)sulfide $((TMS)_2S)$, a trialkyl phosphine sulfide such as (tri-noctylphosphine)sulfide (TOPS), an ammonium salt such as an ammonium halide (e.g., $NH_4Cl$), tris(trimethylsilyl)phosphide $((TMS)_3P)$, tris (trimethylsilyl)arsenide $((TMS)_3As)$, or tris(trimethylsilyl) antimonide $((TMS)_3Sb)$. In certain embodiments, the M donor and the X donor can be moieties within the same molecule.

One example of a preferred method for preparing monodisperse quantum dots comprises pyrolysis of organometallic reagents, such as dimethyl cadmium, injected into a hot, coordinating solvent. This permits discrete nucleation and results in the controlled growth of macroscopic quantities of quantum dots. The injection produces a nucleus that can be grown in a controlled manner to form a quantum dot. The reaction mixture can be gently heated to grow and anneal the quantum dot. Both the average size and the size distribution of the quantum dots in a sample are dependent on the growth temperature. The growth temperature for maintaining steady growth increases with increasing average crystal size. Resulting quantum dots are members of a population of quantum dots. As a result of the discrete nucleation and controlled growth, the population of quantum dots that can be obtained has a narrow, monodisperse distribution of diameters. The monodisperse distribution of diameters can also be referred to as a size. Preferably, a monodisperse population of particles includes a population of particles wherein at least about 60% of the particles in the population fall within a specified particle size range. A population of monodisperse particles preferably deviate less than 15% rms (root-mean-square) in diameter and more preferably less than 10% rms and most preferably less than 5%.

The process of controlled growth and annealing of the quantum dots in the coordinating solvent that follows nucleation can also result in uniform surface derivatization and regular core structures. As the size distribution sharpens, the temperature can be raised to maintain steady growth. For example, by adding more M donor or X donor, the growth period can be shortened. A coordinating solvent can help control the growth of the quantum dot. A coordinating solvent is a compound having a donor lone pair that, for example, a lone electron pair available to coordinate to a surface of the growing quantum dot (including, e.g., a semiconductor nanocrystal). Solvent coordination can stabilize the growing quantum dot. Examples of coordinating solvents include alkyl phosphines, alkyl phosphine oxides, alkyl phosphonic acids, or alkyl phosphinic acids, however, other coordinating solvents, such as pyridines, furans, and amines may also be suitable for the quantum dot (e.g., semiconductor nanocrystal) production. Additional examples of suitable coordinating solvents include pyridine, tri-n-octyl phosphine (TOP), tri-n-octyl phosphine oxide (TOPO) and trishydroxylpropylphosphine (tHPP), tributylphosphine, tri(dodecyl)phosphine, dibutyl-phosphite, tributyl phosphite, trioctadecyl phosphite, trilauryl phosphite, tris(tridecyl)phosphite, triisodecyl phosphite, bis(2-ethylhexyl)phosphate, tris(tridecyl)phosphate, hexadecylamine, oleylamine, octadecylamine, bis(2-ethylhexyl)amine, octylamine, dioctylamine, trioctylamine, dodecylamine/laurylamine, didodecylamine tridodecylamine, hexadecylamine, dioctadecylamine, trioctadecylamine, phenylphosphonic acid, hexylphosphonic acid, tetradecylphosphonic acid, octylphosphonic acid, octadecylphosphonic acid, propylenediphosphonic acid, phenylphosphonic acid, aminohexylphosphonic acid, dioctyl ether, diphenyl ether, methyl myristate, octyl octanoate, and hexyl octanoate. In certain embodiments, technical grade TOPO can be used.

In certain embodiments, quantum dots can alternatively be prepared with use of non-coordinating solvent(s).

Size distribution during the growth stage of the reaction can be estimated by monitoring the absorption or emission line widths of the particles. Modification of the reaction temperature in response to changes in the absorption spectrum of the particles allows the maintenance of a sharp particle size distribution during growth. Reactants can be added to the nucleation solution during crystal growth to grow larger crystals. For example, for CdSe and CdTe, by stopping growth at a particular semiconductor nanocrystal average diameter and choosing the proper composition of the semiconducting material, the emission spectra of the semiconductor nanocrystals can be tuned continuously over the wavelength range of 300 nm to 5 microns, or from 400 nm to 800 nm.

The particle size distribution of the quantum dots (including, e.g., semiconductor nanocrystals) can be further refined by size selective precipitation with a poor solvent for the quantum dots, such as methanol/butanol. For example, quantum dots can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected quantum dot (e.g., semiconductor nanocrystal) population preferably has no more than a 15% rms deviation from mean diameter, more preferably 10% rms deviation or less, and most preferably 5% rms deviation or less.

An example of an overcoating process is described, for example, in U.S. Pat. No. 6,322,901. By adjusting the temperature of the reaction mixture during overcoating and monitoring the absorption spectrum of the core, overcoated materials having high emission quantum efficiencies and narrow size distributions can be obtained.

The narrow size distribution of the quantum dots (including, e.g., semiconductor nanocrystals) allows the possibility of light emission in narrow spectral widths. Monodisperse semiconductor nanocrystals have been described in detail in Murray et al. (J. Am. Chem. Soc., 115:8706 (1993). The foregoing is hereby incorporated herein by reference in its entirety.

The emission from a quantum dot capable of emitting light can be a narrow Gaussian emission band that can be tuned through the complete wavelength range of the ultraviolet, visible, or infra-red regions of the spectrum by varying the size of the quantum dot, the composition of the quantum dot, or both. For example, a semiconductor nanocrystal comprising CdSe can be tuned in the visible region; a semiconductor nanocrystal comprising InAs can be tuned in the infra-red region. The narrow size distribution of a population of quantum dots capable of emitting light can result in emission of light in a narrow spectral range. The population can be monodisperse preferably exhibits less than a 15% rms (root-mean-square) deviation in diameter of such quantum dots, more preferably less than 10%, most preferably less than 5%. Spectral emissions in a narrow range of no greater than about 75 nm, preferably no greater than about 60 nm, more preferably no greater than about 40 nm, and most preferably no greater than about 30 nm full width at half max (FWHM) for such quantum dots that emit in the visible can be observed. IR-emitting quantum dots can have a FWHM of no greater than 150 nm, or no greater than 100 nm. Expressed in terms of the energy of the emission, the emission can have a FWHM of no greater than 0.05 eV, or no greater than 0.03 eV. The breadth of the emission decreases as the dispersity of the light-emitting quantum dot diameters decreases.

Quantum dots can have emission quantum efficiencies such as greater than 10%, 20%, 30%, 40%, 50%, 60%, 70%, 80%, or 90%.

The narrow FWHM of quantum dots can result in saturated color emission. The broadly tunable, saturated color emission over the entire visible spectrum of a single material system is unmatched by any class of organic chromophores (see, for example, Dabbousi et al., J. Phys. Chem. 101, 9463 (1997), which is incorporated by reference in its entirety). A monodisperse population of quantum dots will emit light spanning a narrow range of wavelengths.

As used herein, "top", "bottom", "over", and "under" are relative positional terms, based upon a location from a reference point. Where, e.g., a layer is described as disposed or deposited "over" another layer, component, or substrate, there may be other layers, components, etc. between the layer and the other layer, component or substrate. As used herein, "cover" is also a relative position term, based upon a location from a reference point. For example, where a first material is described as covering a second material, the first material is disposed over, but not necessarily in contact with the second material.

As used herein, the singular forms "a", "an" and "the" include plural unless the context clearly dictates otherwise. Thus, for example, reference to an emissive material includes reference to one or more of such materials.

Applicants specifically incorporate the entire contents of all cited references in this disclosure. Further, when an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

What is claimed is:

1. A quantum dot including a fluorine-containing ligand attached to a surface thereof and further including a coating comprising a fluoropolymer that surrounds the outer surface of the quantum dot and the fluorine-containing ligand attached to the surface thereof,
   wherein the fluoropolymer comprises a first functional group on the inner surface of the coating, wherein the first functional group comprises an aliphatic moiety comprising a main chain including at least 2 carbon atoms and one or more fluorine atoms, and wherein the first functional group is associated with the fluorine-containing ligand attached to the surface of the quantum dot,
   wherein the fluoropolymer further comprises a plurality of non-fluorine containing functional groups on an outer surface of the coating, and
   wherein the coating comprising the fluoropolymer has a thickness less than or equal to 100 nm.

2. A quantum dot in accordance with claim 1 wherein the fluoropolymer further includes one or more additional functional groups.

3. A quantum dot in accordance with claim 2 wherein an additional functional group comprises a hydroxyl group.

4. A quantum dot in accordance with claim 1 wherein the coating comprising the fluoropolymer functions as an electronic insulating layer around the quantum dot.

5. A quantum dot in accordance with claim 1 wherein the coating comprising the fluoropolymer allows energy transfer as the mode of quantum dot excitation.

6. A quantum dot in accordance with claim 1 further comprising one or more additional functional groups on the outer surface of the coating comprising the fluoropolymer, wherein at least one of the additional functional groups is selected to provide the coated quantum dot with predetermined properties.

7. A quantum dot in accordance with claim 1 further comprising one or more additional functional groups on the outer surface of the coating comprising the fluoropolymer, wherein at least one of the additional functional groups is selected to provide the coated quantum dot with hydrophilic characteristics.

8. A quantum dot in accordance with claim 1 further comprising one or more additional functional groups on the outer surface of the coating comprising the fluoropolymer, wherein at least one of the additional functional groups is selected to provide the coated quantum dot with hydrophobic characteristics.

9. A device comprising a pair of electrodes and including a layer therebetween, the layer comprising a quantum dot including a fluorine-containing ligand attached to a surface thereof and further including a coating comprising a fluoropolymer that surrounds the outer surface of the quantum dot and the fluorine-containing ligand attached to the surface thereof,
   wherein the fluoropolymer comprises a first functional group on the inner surface of the coating, wherein the first functional group comprises an aliphatic moiety comprising a main chain including at least 2 carbon atoms and one or more fluorine atoms, and wherein the first functional group is associated with the fluorine-containing ligand attached to the surface of the quantum dot,
   wherein the fluoropolymer further comprises a plurality of non-fluorine containing functional groups on an outer surface of the coating, and
   wherein the coating comprising the fluoropolymer has a thickness less than or equal to 100 nm.

10. A device in accordance with claim 9 further including a protective coating over a surface of the device opposite a substrate on which the device is supported.

11. A light-emitting device comprising a pair of electrodes and including a layer therebetween, the layer comprising an emissive material comprising a quantum dot including a fluorine-containing ligand attached to a surface thereof and further including a coating comprising a fluoropolymer that surrounds the outer surface of the quantum dot and the fluorine-containing ligand attached to the surface thereof,
   wherein the fluoropolymer comprises a first functional group on the inner surface of the coating, wherein the first functional group comprises an aliphatic moiety comprising a main chain including at least 2 carbon atoms and one or more fluorine atoms, and wherein the first functional group is associated with the fluorine-containing ligand attached to the surface of the quantum dot,
   wherein the fluoropolymer further comprises a plurality of non-fluorine containing functional groups on an outer surface of the coating, and
   wherein the coating comprising the fluoropolymer has a thickness less than or equal to 100 nm.

12. A light-emitting device in accordance with claim 11 further including a protective coating over a surface of the device opposite a substrate on which the device is supported.

13. An emissive material comprising a quantum dot in accordance with claim 1.

14. A quantum dot in accordance with claim 1 wherein the fluoropolymer further includes one or more additional functional groups.

15. A quantum dot in accordance with claim 1 wherein an outer portion of the fluoropolymer is functionalized with a group that has energy transferring properties.

* * * * *